(12) United States Patent  
Kawashima et al.

(10) Patent No.: US 8,379,685 B2
(45) Date of Patent: Feb. 19, 2013

(54) SURFACE EMITTING LASER

(75) Inventors: Shoichi Kawashima, Kawasaki (JP); Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/284,069

(22) Filed: Oct. 28, 2011

(65) Prior Publication Data

US 2012/0114006 A1 May 10, 2012

(30) Foreign Application Priority Data

Nov. 5, 2010 (JP) ................... 2010-249158

(51) Int. Cl.
*H01S 3/098* (2006.01)
*H01S 5/00* (2006.01)

(52) U.S. Cl. .................. 372/50.124; 372/18; 372/43.01
(58) Field of Classification Search .............. 372/50.124
See application file for complete search history.

(56) References Cited

U.S. PATENT DOCUMENTS

| | | | |
|---|---|---|---|
| 7,499,480 B2 | 3/2009 | Nagatomo | 372/50.124 |
| 7,535,946 B2 | 5/2009 | Nagatomo et al. | 372/50.124 |
| 7,796,666 B2 | 9/2010 | Nagatomo | 372/50.124 |
| 7,869,483 B2 | 1/2011 | Uchida et al. | 372/99 |
| 8,130,808 B2 | 3/2012 | Hoshino et al. | 372/50.124 |
| 8,149,892 B2 | 4/2012 | Nagatomo et al. | 372/99 |
| 2009/0225805 A1 | 9/2009 | Nagatomo | 372/99 |
| 2011/0158280 A1 | 6/2011 | Nagatomo et al. | 372/50.1 |
| 2011/0216796 A1 | 9/2011 | Nagatomo et al. | 372/45.01 |

OTHER PUBLICATIONS

K. Sakai et al., "Lasing Band-Edge Identification for a Surface-Emitting Photonic Laser", *IEEE Jour. on Selected Areas in Communications*, vol. 23, No. 7, pp. 1335-1340 (2005).

*Primary Examiner* — Armando Rodriguez
(74) *Attorney, Agent, or Firm* — Fitspatrick, Cella, Harper & Scinto

(57) ABSTRACT

A surface emitting laser emitting a laser beam in a single transverse mode irrespective of an emission area while one-dimensionally aligning polarization of the output beam, including a two-dimensional photonic crystal, having resonance modes in directions of the primitive translation vector $a_1$ and $a_2$, lengths $|a_1|$ and $|a_2|$ of the primitive translation vectors $a_1$ and $a_2$ satisfied $|a_1|=p\times(\lambda_1/2n_{\it{eff1}})$, $|a_2|=\lambda_2/2n_{\it{eff2}}$ described by a resonance wavelengths $\lambda_1$ and $\lambda_2$ in the resonance modes in the $a_1$ and $a_2$ directions, effective refractive indexes $n_{\it{eff1}}$ and $n_{\it{eff2}}$ determined by the resonance modes in the $a_1$ and $a_2$ directions, an integer p of 2 or more, the resonance wavelengths $\lambda_1$ and $\lambda_2$ satisfy $\lambda_2 \leq 2\times(n_{\it{eff2}}/(n_{\it{out}}+n_{\it{eff2}}))\times\lambda_1$ described by the effective refractive index $n_{\it{eff2}}$ and a refractive index $n_{\it{out}}$ of an external medium located out of the surface emitting laser.

5 Claims, 10 Drawing Sheets

SURFACE EMITTING LASER

BACKGROUND OF THE INVENTION

1. Field of the Invention

The present invention relates to a surface emitting laser. Particularly the invention relates to a distributed feedback type photonic crystal surface emitting laser that can align polarization of an output beam in a one-dimensional direction while emitting a laser beam in a single transverse mode.

2. Description of the Related Art

One of the features of the surface emitting laser, which is one of a semiconductor laser, is that light is emitted in a perpendicular direction or an oblique direction with respect to a substrate. Recently there is studied the distributed feedback (DFB) type surface emitting laser that emits a laser beam, which resonates in an in-plane direction of the substrate, to an outside of the plane with a diffraction grating. Hereinafter, the distributed feedback type surface emitting laser is abbreviated to a DFB type surface emitting laser.

Sakai et al. (IEEE JOURNAL ON SELECTED AREAS IN COMMUNICATIONS, vol. 23, 1335 (2005)) disclose a DFB type surface emitting laser in which a two-dimensional photonic crystal, in which a diffraction grating is two-dimensionally formed, is used.

In the two-dimensional photonic crystal disclosed in Sakai et al., two primitive translation vectors have the same length. The length of the primitive translation vector is equal to $\lambda/n_{eff}$ where $\lambda$ denotes an oscillation wavelength and $n_{eff}$ denotes an effective refractive index determined by the resonance mode. Since the two-dimensional photonic crystal in which the two primitive translation vectors have the same length forms a two-dimensional resonance mode, the DFB type surface emitting laser can operate in a single transverse mode regardless of a size of an emission area.

Further, since the primitive translation vector has the length $\lambda/n_{eff}$, the two-dimensional photonic crystal acts as a second-order diffraction grating. A diffraction perpendicular to the plane of the two-dimensional photonic crystal layer is generated by the first-order diffraction, and an in-plane diffraction is generated by the second-order diffraction.

Therefore, the laser light amplified by the in-plane diffraction is perpendicularly emitted by the first-order diffraction. In the perpendicularly-emitted laser beam, polarization reflects two-dimensional resonance, namely, the polarization includes two-dimensional vector components. Sakai et al. discloses an azimuthally polarized beam.

The reason the polarization direction becomes two-dimensional will be described in the following paragraphs by taking the two-dimensional photonic crystal of the related art disclosed in Sakai et al. as an example.

FIGS. 9A to 9C are three-dimensional schematic diagrams illustrating a reciprocal lattice space of the two-dimensional photonic crystal of a related art in which lattice points are arrayed into a square lattice. The numerals X1 and X2 designate primitive translation vectors in the reciprocal lattice space.

The diffraction of a TE-polarized wave vector k1 travelling in an X1 direction will be described with reference to FIG. 9A. The wave vector k1 becomes a diffracted wave k1' in the perpendicular direction by the first-order diffraction. Since the polarization is maintained before and after the diffraction, the polarization direction of the diffracted wave k1' is perpendicular to both the X1 direction and the k1' direction. The polarization is expressed by a dotted-line arrow. At the same time, a diffracted wave k1" travelling in a direction opposite to the diffracted wave k1 by 180 degrees is also generated by second-order diffraction, but the diffracted wave k1" is not involved in the polarization of the light emitted in the perpendicular direction. The diffracted wave k1" contributes to an amplification effect in a gain region.

Similarly the diffraction of a wave vector k2 travelling in an X2 direction will be described with reference to FIG. 9B. The wave vector k2 becomes a diffracted wave k2' in the perpendicular direction by the first-order diffraction. The polarization direction is maintained, and the diffracted wave k2' has the polarization oscillating in a direction perpendicular to both the X1 direction and the k2' direction. At the same time, a diffracted wave k2" travelling in a direction opposite to the diffracted wave k2 by 180 degrees is also generated by the second-order diffraction.

Since the first-order diffraction of the diffracted wave k1' and the first-order diffraction of the diffracted wave k2', which contribute to the perpendicular emission, are simultaneously generated, the diffracted wave k1' and the diffracted wave k2' are coupled in a wave k' emitted in the perpendicular direction as illustrated in FIG. 9C. That is, the wave k' becomes the polarization in which the two-dimensional components are combined.

SUMMARY OF THE INVENTION

In the DFB type surface emitting laser in which the two-dimensional photonic crystal is used, only the laser beam having the two-dimensional polarization direction is obtained while the laser beam is emitted in the single transverse mode. In the case that the laser beam having the two-dimensional polarization is incident to a birefringence optical element, unfortunately an aberration is caused by the polarization.

On the other hand, in the surface emitting laser in which the one-dimensional photonic crystal is used, since only the uni-directional diffraction exists, the output beam inevitably has the one-dimensional polarization. However, in the surface emitting laser in which the one-dimensional photonic crystal is used, when the emission area is enlarged, the transverse mode becomes a multimode.

An object of the invention is to provide a DFB type surface emitting laser that can emit the laser beam in the single transverse mode irrespective of the emission area while one-dimensionally aligning the polarization of the output beam.

A surface emitting laser according to an aspect of the invention includes a two-dimensional photonic crystal that includes a resonance mode in an in-plane direction, wherein the two-dimensional photonic crystal includes two primitive translation vectors of a primitive translation vector $a_1$ and a primitive translation vector $a_2$, which extend in different directions, the resonance mode includes at least a resonance mode in a direction in which the primitive translation vector $a_1$ extends and a resonance mode in a direction in which the primitive translation vector $a_2$ extends, the primitive translation vector $a_1$ has a length $|a_1|$, the primitive translation vector $a_2$ has a length $|a_2|$, the length $|a_1|$ satisfies a relational expression $|a_1|=p\times(\lambda_1/2n_{eff1})$ that is described by a resonance wavelength $\lambda_1$ in the resonance mode in the $a_1$ direction, an effective refractive index $n_{eff1}$ determined by the resonance mode in the $a_1$ direction, and an integer p of 2 or more, the length $|a_2|$ satisfies a relational expression $|a_2|=\lambda_2/2n_{eff2}$ that is described by a resonance wavelength $\lambda_2$ in the resonance mode in the $a_2$ direction and an effective refractive index $n_{eff2}$ determined by the resonance mode in the $a_2$ direction, and the resonance wavelength $\lambda_1$ and the resonance wavelength $\lambda_2$ satisfy a relational expression $\lambda_2 \leq 2\times(n_{eff2}/(n_{out}+n_{eff2}))\times\lambda_1$ that is described by the effective refractive index $n_{eff2}$ and a refractive index $n_{out}$ of an external medium located out of the surface emitting laser.

According to the invention, the DFB type surface emitting laser that can emit the laser beam in the single transverse mode irrespective of the emission area while one-dimensionally aligning the polarization of the output beam can be fabricated.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

A surface emitting laser according to a first embodiment of the invention will be described below.

Figure 1:
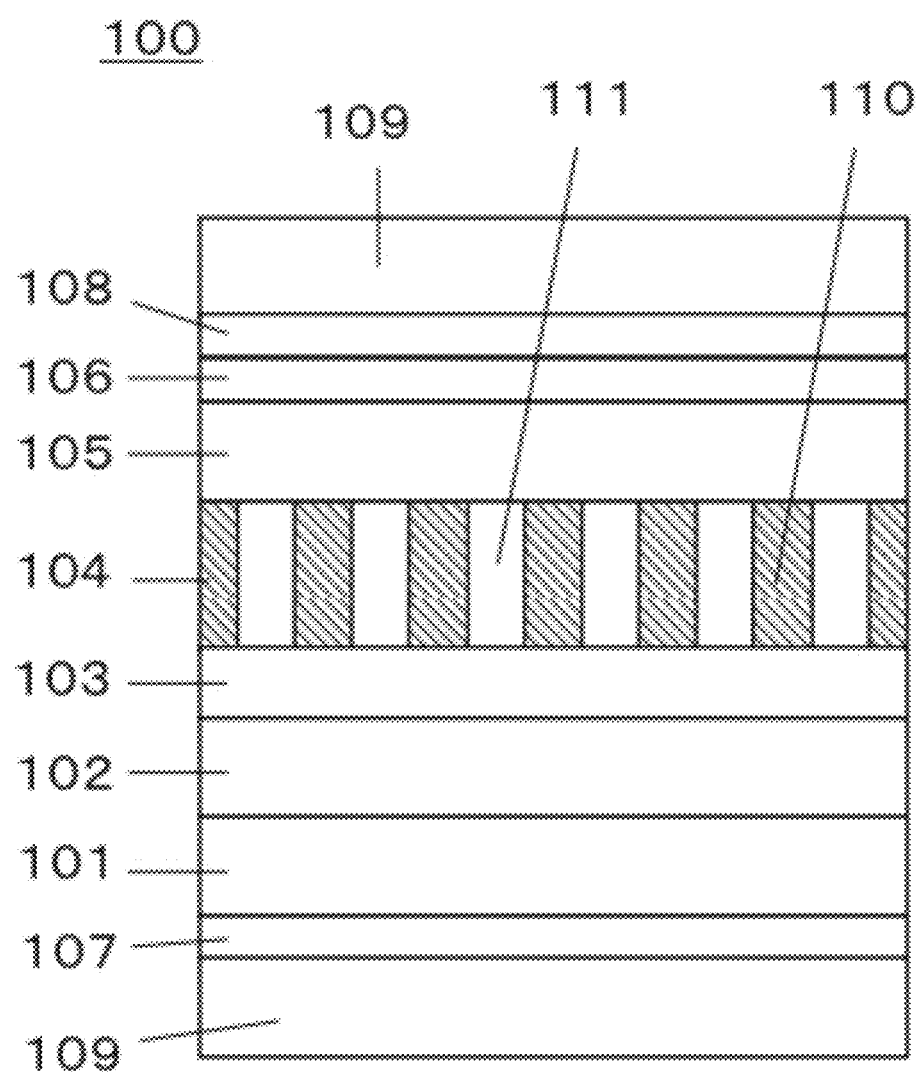
FIG. 1 is a sectional view of a surface emitting laser according to a first embodiment.

A structure of the surface emitting laser of the first embodiment will be described with reference to FIG. 1. In a surface emitting laser 100 of the first embodiment, an n-type clad layer 102, an active layer 103, a two-dimensional photonic crystal layer 104, a p-type clad layer 105, and a contact layer 106 are sequentially stacked on a substrate 101. In the substrate 101, an n-side electrode 107 is formed on a surface opposite the active layer 103. In the contact layer 106, a p-side electrode 108 is formed on a surface opposite the active layer 103. A guided layer (not illustrated) can also be provided between the n-type clad layer 102 and the active layer 103 or between the p-type clad layer 105 and the active layer 103, and the guided layer has a refractive index higher than that of the n-type clad layer 102 and the p-type clad layer 105. The p-type clad layer 105 can be eliminated as long as the light is confined in a stacked direction.

For example, the substrate 101, the n-type clad layer 102, the active layer 103, the p-type clad layer 105, and the contact layer 106 are made of a semiconductor material containing one of elements Al, In, Ga, N, As, P, Sb, B, C, Si, Ge, and Sn. In the first embodiment, the substrate 101 is made of GaN, the n-type clad layer 102 is made of AlGaN, the active layer 103 is made of InGaN, the p-type clad layer 105 is made of AlGaN, and the contact layer 106 is made of GaN.

An outside of the surface emitting laser 100, namely, the outsides of the n-side electrode 107 and the p-side electrode 108 are covered with an external medium 109.

A structure of the two-dimensional photonic crystal layer of the first embodiment will be described with reference to FIG. 2.

Figure 2:
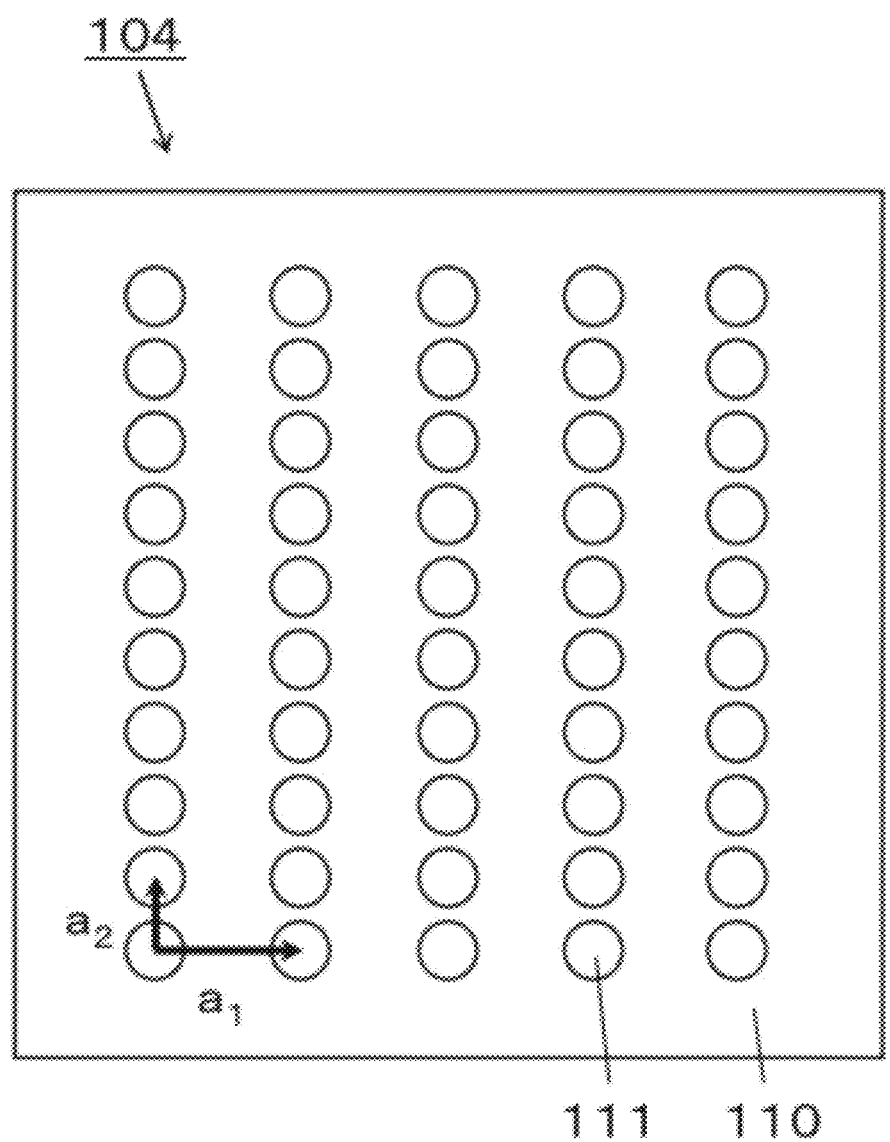
FIG. 2 is a plan view of a two-dimensional photonic crystal layer of the first embodiment.

As illustrated in FIG. 2, in the two-dimensional photonic crystal layer 104 of the first embodiment, cylindrical low refractive index media 111 are arrayed into a rectangular lattice shape in a high refractive index medium 110. The lattice shape can be an oblique lattice to obtain the same effect. For example, the high refractive index medium 110 is made of a semiconductor material containing one of elements Al, In, Ga, N, As, P, Sb, B, C, Si, Ge, and Sn. The low refractive index medium 111 has a refractive index lower than that of the high refractive index medium 110. For example, air or $SiO_2$ is used as the low refractive index medium 111. In the first embodiment, the high refractive index medium 110 is made of GaN, and the low refractive index medium 111 is made of air.

The rectangular lattice of FIG. 2 includes two primitive translation vectors $a_1$ and $a_2$. Since the primitive translation vectors $a_1$ and $a_2$ differ from each other in a length, the two-dimensional photonic crystal has at least a resonance mode in an $a_1$ direction and a resonance mode in an $a_2$ direction, and the resonance modes are not directly optically coupled. In other words, the resonance mode attributed to a diffraction grating in the $a_1$ direction and the resonance mode attributed to a diffraction grating in the $a_2$ direction can independently be controlled, and different functions can be provided to the diffraction gratings, respectively.

In view of above, in the present invention, the diffraction grating in the $a_1$ direction has a function of emitting light having a wavelength $\lambda_1$ to the outside of the plane. On the other hand, the diffraction grating in the $a_2$ direction has a function of controlling a transverse mode of the laser by a refractive index periodic structure. At this point, the diffraction grating in the $a_2$ direction has a period such that the light having the wavelength $\lambda_1$ is not diffracted to the outside of the plane. Therefore, the surface emitting laser that emits the laser beam in the single transverse mode while the polarization of the output beam is aligned in the one-dimensional direction can be fabricated.

The length of the primitive translation vector $a_1$ in the diffraction grating in the $a_1$ direction will be described. In the first embodiment, $|a_1|$ is set to the length satisfying a relational expression $|a_1|=p\times(\lambda_1/2n_{eff1})$ where $|a_1|$ denotes the length of the primitive translation vector $a_1$, $\lambda_1$ denotes a resonance wavelength of the resonance mode in the $a_1$ direction, $n_{eff1}$ denotes an effective refractive index determined by the resonance mode in the $a_1$ direction and p denotes an integer of 2 or more.

In the first embodiment, because of p=2 and $|a_1|=161.35$ nm, the light having the wavelength $\lambda_1=405$ nm generated from the active layer 103 is diffracted in a direction perpendicular to the surface by first-order diffraction, and the light is diffracted in an in-plane direction of a 180-degree turn by second-order diffraction.

The length of the primitive translation vector $a_2$ in the diffraction grating in the $a_2$ direction will be described. In the first embodiment, $|a_2|$ is set to the length satisfying a relational expression $|a_2|=\lambda_2/2n_{\mathit{eff}2}$ where $|a_2|$ denotes the length of the primitive translation vector $a_2$, $\lambda_2$ denotes a resonance wavelength of the resonance mode in the $a_2$ direction and $n_{\mathit{eff}2}$ denotes an effective refractive index determined by the resonance mode in the $a_2$ direction.

Additionally, the resonance wavelength $\lambda_1$ and the resonance wavelength $\lambda_2$ are set so as to satisfy a relational expression $\lambda_2 \leq 2\times(n_{\mathit{eff}2}/(n_{\mathit{out}}+n_{\mathit{eff}2}))\times\lambda_1$ that is described by the effective refractive index $n_{\mathit{eff}2}$ and a refractive index $n_{\mathit{out}}$ of the external medium 109.

When the conditions are satisfied, the light having the wavelength $\lambda_1$ is not diffracted to the outside of the plane by the diffraction grating formed in the $a_2$ direction. That is, the polarization of the laser beam having the wavelength $\lambda_1$, which is emitted to the outside of the plane from the surface emitting laser 100, can be formed only by a one-dimensional component.

The diffraction phenomenon will be described with reference to FIG. 3.

Figure 3:
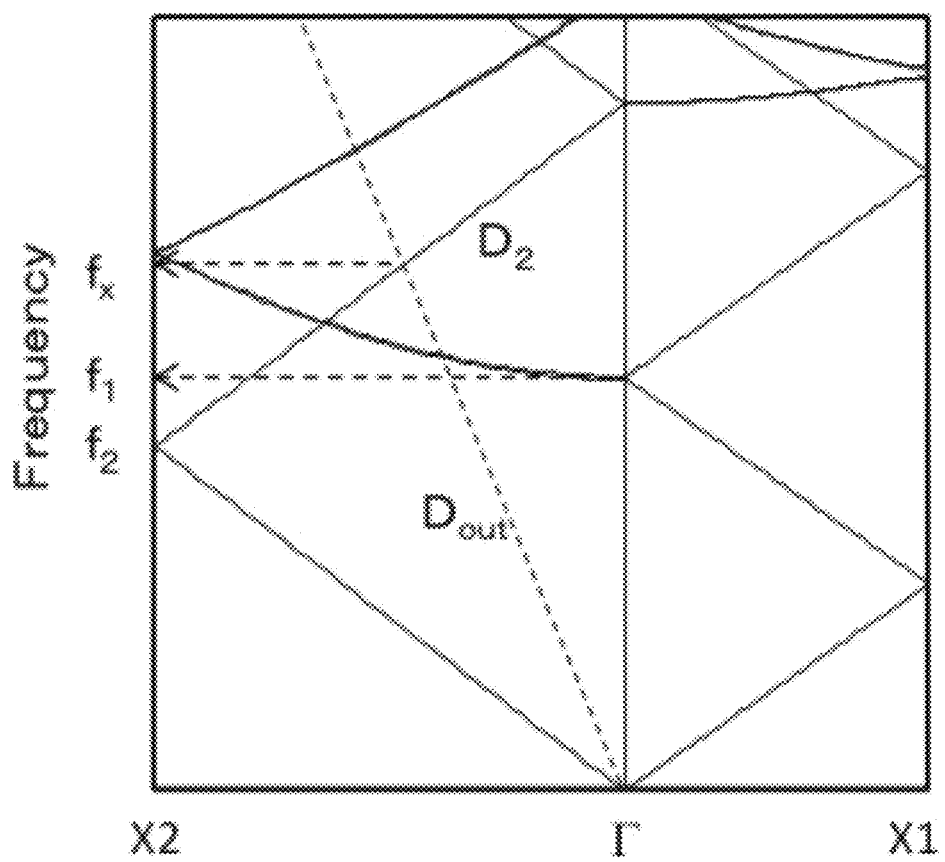
FIG. 3 is a view illustrating a photonic band of the first embodiment.

FIG. 3 is a view illustrating a photonic band diagram in an X1 direction and an X2 direction. The X1 direction and the X2 direction express primitive reciprocal lattice vectors, the X1 direction corresponds to the $a_1$ direction of a real space, and the X2 direction corresponds to the $a_2$ direction of the real space. A frequency $f_1$ corresponds to the resonance wavelength $\lambda_1$, and a frequency $f_2$ corresponds to the resonance wavelength $\lambda_2$. $D_2$ is a dispersion curve based on the diffraction grating in the $a_2$ direction, and $D_{out}$ is a light line determined by the refractive index $n_{out}$ of the external medium 109 located out of the surface emitting laser 100.

$f_x$ is a frequency at an intersection point of the dispersion curve $D_2$ and the light line $D_{out}$. The frequency $f_x$ larger than the frequency $f_1$ may be the condition that the light having the frequency $f_1$ corresponding to the resonance wavelength $\lambda_1$ is not output to the outside of the plane by the diffraction in the X2 direction.

This will be described below using equations.

The dispersion curve $D_2$ folded at a point X2 is expressed by the following equation 1.

$$D_2 = -(1/n_{\mathit{eff}2})\times k + 2/n_{\mathit{eff}1}\times(\lambda_1/\lambda_2) \quad \text{(equation 1)}$$

On the other hand, the light line $D_{out}$ is expressed by the following equation 2.

$$D_{out} = 1/n_{out}\times k \quad \text{(equation 2)}$$

Therefore, the frequency $f_x$ at the intersection point of the dispersion curve $D_2$ and the light line $D_{out}$ is expressed by the following equation 3.

$$f_x = 2\times(n_{\mathit{eff}2}/n_{\mathit{eff}1})\times(1/(n_{out}+n_{\mathit{eff}2}))\times(\lambda_1/\lambda_2) \quad \text{(equation 3)}$$

Because of $f_1 \leq f_x$, the following equation 4 is derived.

$$\lambda_2 \leq 2\times(n_{\mathit{eff}2}/(n_{out}+n_{\mathit{eff}2}))\times\lambda_1 \quad \text{(equation 4)}$$

In the first embodiment, the external medium is air, and the air has refractive index $n_{out}$ of 1. Therefore, the following equation 5 is derived.

$$\lambda_2 \leq 2\times(n_{\mathit{eff}2}/(1+n_{\mathit{eff}2}))\times\lambda_1 \quad \text{(equation 5)}$$

When the relationship of the equation 5 is transformed into a relational expression of $|a_1|$ and $|a_2|$, the following equation 6 is obtained.

$$|a_2| \leq 2\times n_{\mathit{eff}1}/(1+n_{\mathit{eff}2})\times|a_1| \quad \text{(equation 6)}$$

In the first embodiment, $|a_2|=78.13$ nm and $\lambda_2=400$ nm.

The diffraction phenomena in the diffraction gratings formed in the $a_1$ direction and $a_2$ direction will be described along with the polarization direction with reference to FIGS. 4A, 4B, and 4C.

Figure 4A:
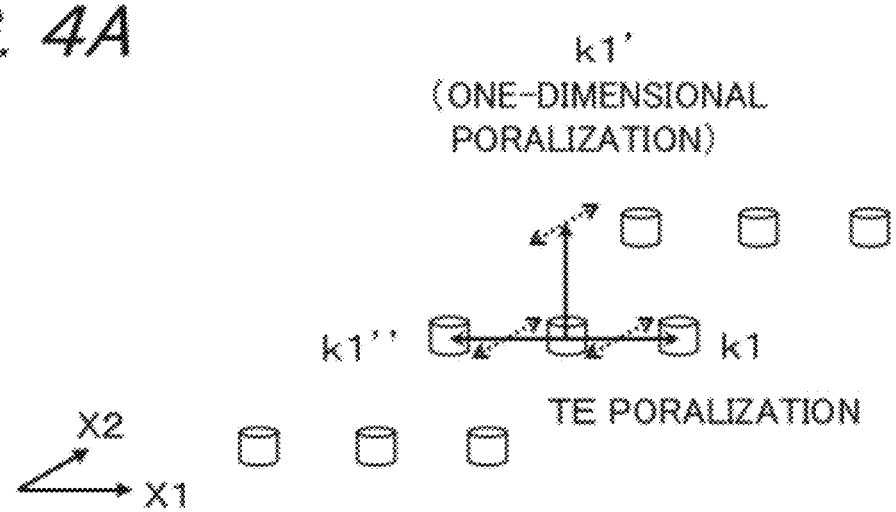
FIGS. 4A, 4B, and 4C are three-dimensional schematic diagrams of a reciprocal lattice space expressing a diffraction phenomenon of the first embodiment.
Figure 4B:
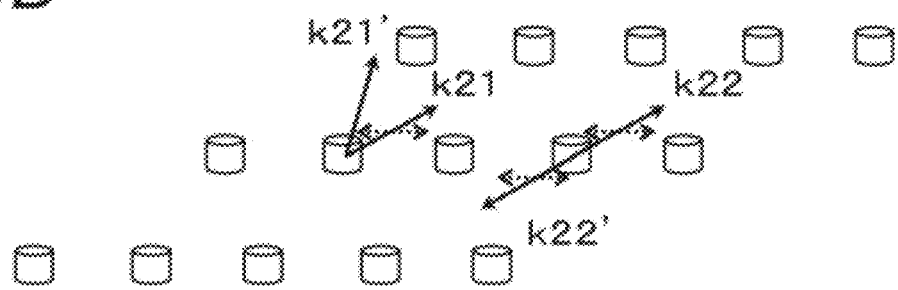
Figure 4C:
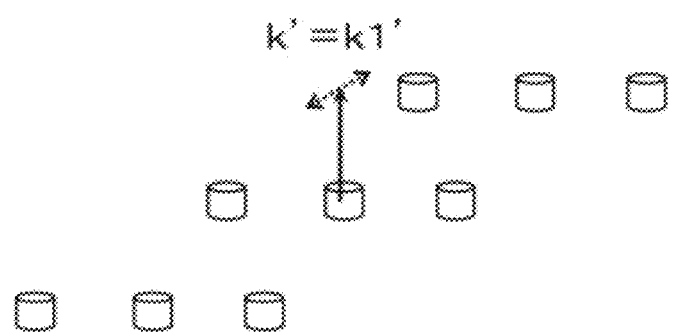

FIGS. 4A, 4B, and 4C three-dimensionally illustrate a reciprocal lattice space corresponding to the two-dimensional photonic crystal structure of the first embodiment, and schematically illustrate the diffraction phenomenon in the two-dimensional photonic crystal. In FIGS. 4A, 4B, and 4C, the polarization is expressed by a dotted-line arrow.

The diffraction of a wave vector k1 equal to wavelength $\lambda_1$ travelling in the X1 direction will be described with reference to FIG. 4A. The wave vector k1 becomes a diffracted wave k1' in the perpendicular direction by the first-order diffraction. Since the polarization is maintained before and after the diffraction, the polarization direction of the diffracted wave k1' is perpendicular to both the X1 direction and the k1' direction. The second-order diffraction is also generated at the same time as the first-order diffraction is generated, a diffracted wave k1" travelling in a direction opposite to the diffracted wave k1 by 180 degrees is generated, but the diffracted wave k1" does not affect the polarization of the light emitted in the perpendicular direction. The diffracted wave k1" contributes to an amplification effect in a gain region.

The diffraction of a wave vector k21 having wavelength $\lambda_2$ and a wave vector k22 having wavelength $\lambda_2$, which travel in the X2 direction, will be described with reference to FIG. 4B. The wave vector k21 becomes a diffracted wave k21' in an out-of-plane direction by the first-order diffraction. However, when the diffracted wave k21' satisfies the relationship of $\lambda_2 \leq 2\times(n_{\mathit{eff}2}/(1+n_{\mathit{eff}2}))\times\lambda_1$, the diffracted wave k21' is totally reflected at an interface between the air and the contact layer 106 or the p-side electrode 108, and the diffracted wave k21' is not output to the outside. The wave vector k22 becomes a diffracted wave k22' travelling in the direction opposite to the diffracted wave k22 by 180 degrees by the first-order diffraction, but the diffracted wave k22' is not output to the outside of the plane.

As described above, only the first-order diffraction k1' from the X1 direction is involved in the wave k' diffracted in the out-of-plane direction (in the first embodiment, the perpendicular direction). That is, as illustrated in FIG. 4C, the perpendicularly-output light has the polarization that is perpendicular to both the X1 direction and k1' direction and one-dimensionally aligned.

The surface emitting laser 100 of the first embodiment can emit the laser beam in the single transverse mode.

Figure 5:
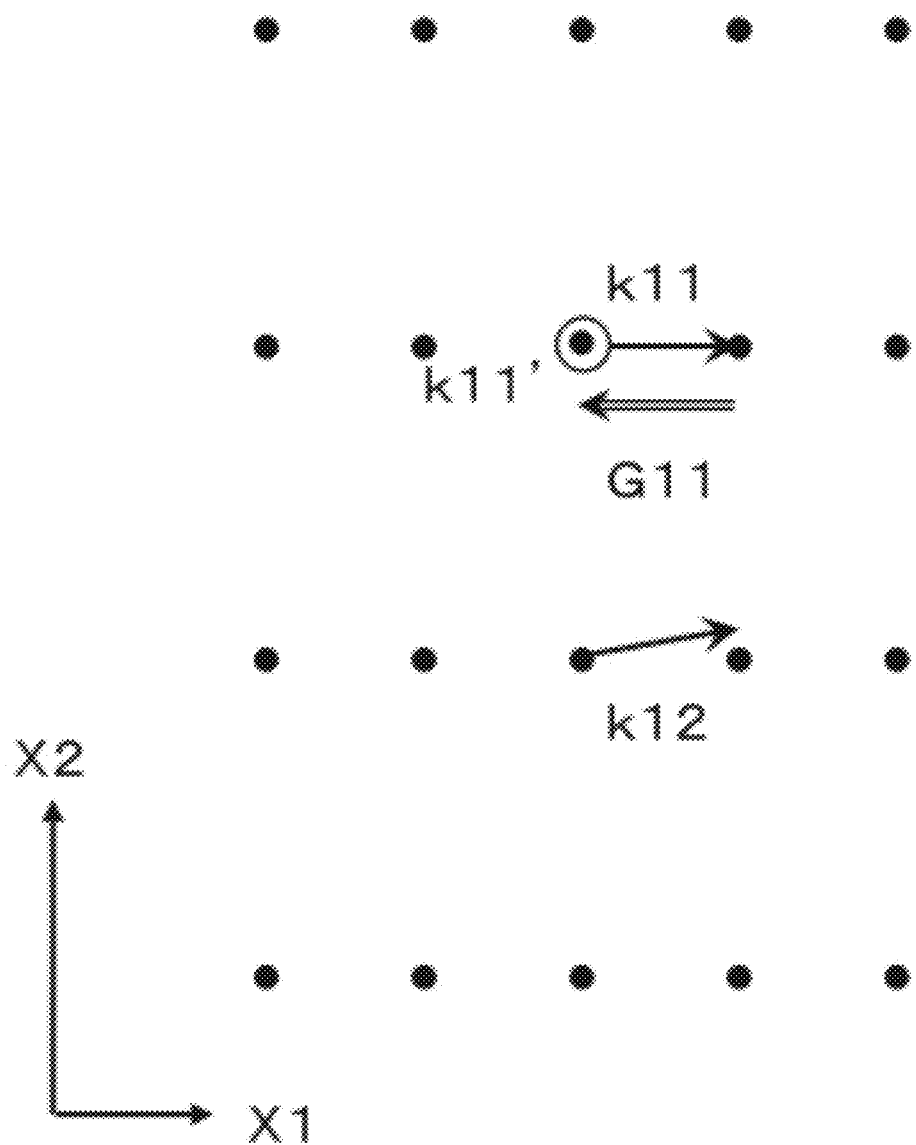
FIG. 5 is a plan view of the reciprocal lattice space of the first embodiment.

FIG. 5 is a plan view illustrating the reciprocal lattice space of the two-dimensional photonic crystal of the first embodiment. A wave vector k11 travelling in the X1 direction becomes k11' diffracted in the perpendicular direction by a reciprocal lattice vector G11. On the other hand, a wave vector k12 travelling in a direction slightly deviated from the X1 direction causes a multi-transverse mode in the case of the one-dimensional photonic crystal surface emitting laser. However, in the first embodiment, an optical mode is uniquely determined since the periodic structure is formed in the X2 direction. That is, k12 is present as a guide mode propagating in the diffraction grating, or the optical mode is not present in the direction of k12.

Even if a width of a surface emission area is increased, the transverse mode in which the laser beam is emitted in the perpendicular direction is attributed only to k11'. This enables the single-transverse-mode oscillation. A profile of the oscillation mode can also be controlled by a gain distribution in the two-dimensional photonic crystal.

A lower limit of the length of the primitive translation vector $a_2$ is determined as follows.

Preferably a relational expression $|a_2| \geq \lambda_S/2n_{eff2}$ in which the length of the primitive translation vector $a_2$ of the rectangular lattice of FIG. 2 is described by the shortest wavelength $\lambda_S$ in an emission wavelength region of the active layer 103, namely, $\lambda_S \leq \lambda_2$ is satisfied.

In the rectangular lattice of the first embodiment, the primitive translation vectors $a_1$ and $a_2$ differ from each other in the length. Therefore, in the reciprocal lattice space, the primitive reciprocal lattice vectors in the X1 and X2 directions differ from each other in the length. Accordingly, the resonance mode in the $a_1$ direction and the resonance mode in an $a_2$ direction are not optically coupled. In other words, a carrier, which is converted into the light having the resonance wavelength $\lambda_2$ in the $a_2$ direction by the active layer 103, does not contribute to the surface emission light. Although the light in the resonance mode in the $a_2$ direction has the advantage that the transverse mode can be controlled by the diffraction grating in the $a_2$ direction, the light in the resonance mode in the $a_2$ direction is not efficient from viewpoint of energy efficiency of the surface emitting laser.

Therefore, preferably a relational expression $|a_2| \geq \lambda_S/2n_{eff2}$ in which the length of the primitive translation vector $a_2$ is described by the shortest wavelength $\lambda_S$ in the emission wavelength region of the active layer 103, namely, $\lambda_S \leq \lambda_2$ is satisfied. When the relational expression is satisfied, the energy efficiency can be improved by photon recycling.

Specifically, the light having the resonance wavelength $\lambda_2$, which resonates in the $a_2$ direction, is reabsorbed at the active layer 103 to become the carrier. Then the carrier recombines in the active layer 103 and becomes the light having the resonance wavelength $\lambda_1$ which resonates in the $a_1$ direction. In the phenomenon, it is necessary that the resonance wavelength $\lambda_2$ be included in an absorption band of the active layer 103, namely, it is necessary that the resonance wavelength $\lambda_2$ be included in the emission wavelength band of the active layer 103, and it is also necessary that the light having the resonance wavelength $\lambda_2$ has the energy higher than that of the resonance wavelength $\lambda_1$ after the conversion. Therefore, preferably the relational expression $\lambda_S \leq \lambda_2 \leq \lambda_1$ is satisfied. $\lambda_S = 380$ nm is obtained because an emission wavelength region of the active layer 103 of the first embodiment ranges from 380 nm to 420 nm, and $\lambda_S \leq \lambda_2 \leq \lambda_1$ is satisfied because of $\lambda_2 = 400$ nm and $\lambda_1 = 405$ nm.

A relationship among the gain of the active layer 103, $\lambda_1$, and $\lambda_2$ will be described below. In the first embodiment, the light having the resonance wavelength $\lambda_1$, which resonates in the $a_1$ direction, is diffracted in the direction perpendicular to the plane after the laser oscillation. The light having the resonance wavelength $\lambda_2$, which resonates in the $a_2$ direction, can be converted into the light having the resonance wavelength $\lambda_1$ by the photon recycling. However, from the viewpoint of the energy efficiency, the carrier should be consumed as the light having the resonance wavelength $\lambda_1$ from the beginning. Therefore, preferably the gain of the active layer 103 with respect to the resonance wavelength $\lambda_1$ is larger than the gain of the active layer 103 with respect to the resonance wavelength $\lambda_2$. More preferably a peak of the gain of the active layer 103 may be matched with the resonance wavelength $\lambda_1$. In the first embodiment, the peak of the gain is matched with the resonance wavelength $\lambda_1$.

Figure 6:
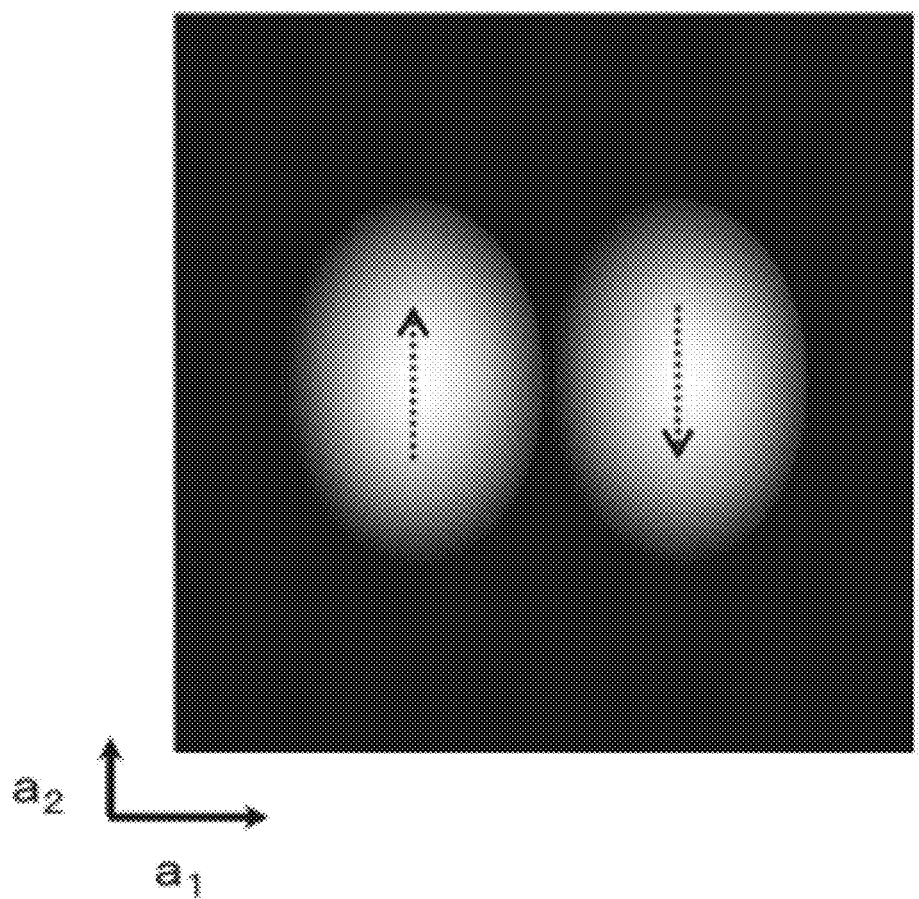
FIG. 6 is a view illustrating a far field pattern and a polarization direction of the surface emitting laser of the first embodiment.

FIG. 6 illustrates a schematic view of a far field pattern of the beam that is perpendicularly emitted from the surface emitting laser 100 of the first embodiment. Although a profile of the far field depends on an optical coupling coefficient of the diffraction grating in the $a_2$ direction, the double-peaked beam profile exists in the $a_1$ direction. Although a phase of the polarization rotates by 180 degrees at each peak position, the one-dimensional polarization in which the polarization direction includes only a component in the $a_2$ direction is obtained. The dotted line of FIG. 6 expresses the polarization direction and the phase.

(Second Embodiment)

In a second embodiment, the lengths of the primitive translation vectors $a_1$ and $a_2$ of the two-dimensional photonic crystal of the first embodiment are changed.

The length $|a_1|$ of primitive translation vector $a_1$ satisfies $|a_1| = 4 \times (\lambda_1/2n_{eff1})$, namely, the two-dimensional photonic crystal is a fourth-order diffraction grating. More specifically, in the second embodiment, $|a_1| = 645.4$ nm and $\lambda_1 = 405$ nm. The length $|a_2|$ of the primitive translation vector $a_2$ satisfies $|a_2| = \lambda_2/2n_{eff2}$. More specifically, in the second embodiment, $|a_2| = 80.66$ nm and $\lambda_2 = 413$ nm. In the second embodiment, since of $\lambda_2 = 1.02 \times \lambda_1$ and $n_{eff2} = 2.56$, the relational expression $\lambda_2 \leq 2 \times (n_{eff2}/(1+n_{eff2})) \times \lambda_1$ is satisfied.

Figure 7A:
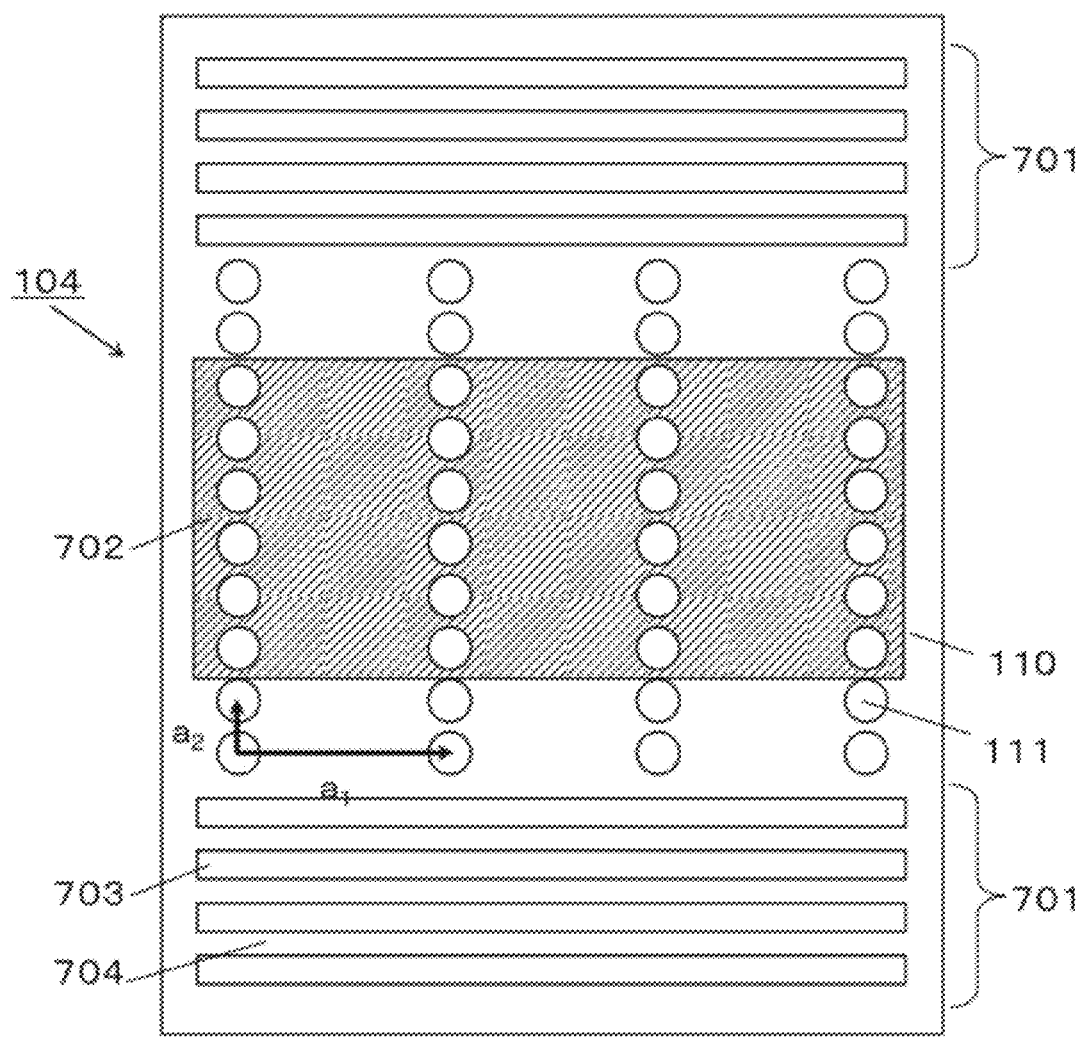
FIG. 7A is a plan view of a two-dimensional photonic crystal layer according to a second embodiment.

FIG. 7A is a plan view illustrating a two-dimensional photonic crystal layer 104 of the second embodiment. On the outside of the two-dimensional photonic crystal, the two-dimensional photonic crystal layer 104 includes a distributed Bragg reflector 701 that reflects the light having the wavelengths of $\lambda_S$ to $\lambda_1$ toward a gain region 702. The distributed Bragg reflector 701 includes a low refractive index medium 703 and a high refractive index medium 704. In the second embodiment, the low refractive index medium 703 is made of air, and the high refractive index medium 704 is made of GaN. Using the distributed Bragg reflector 701, the light having the wavelengths of $\lambda_S$ to $\lambda_1$, which leaks to the outside of the two-dimensional photonic crystal, particularly in the $a_2$ direction, can be reused as the laser beam having the wavelength $\lambda_1$ by the photon recycling.

In FIG. 7A, the distributed Bragg reflector 701 is disposed only in the $a_2$ direction. Alternatively the distributed Bragg reflector may also be disposed in the $a_1$ direction.

In a surface emitting laser 100 of the second embodiment, since the fourth-order diffraction grating is used in the $a_1$ direction, the beam emitted to the outside of the plane includes the total of three output beams, namely, a beam emitted in the perpendicular direction and two symmetric beams emitted obliquely in a direction between in the $a_1$ direction and in the perpendicular direction. Each of the three beams includes the one-dimensional component.

Figure 7B:
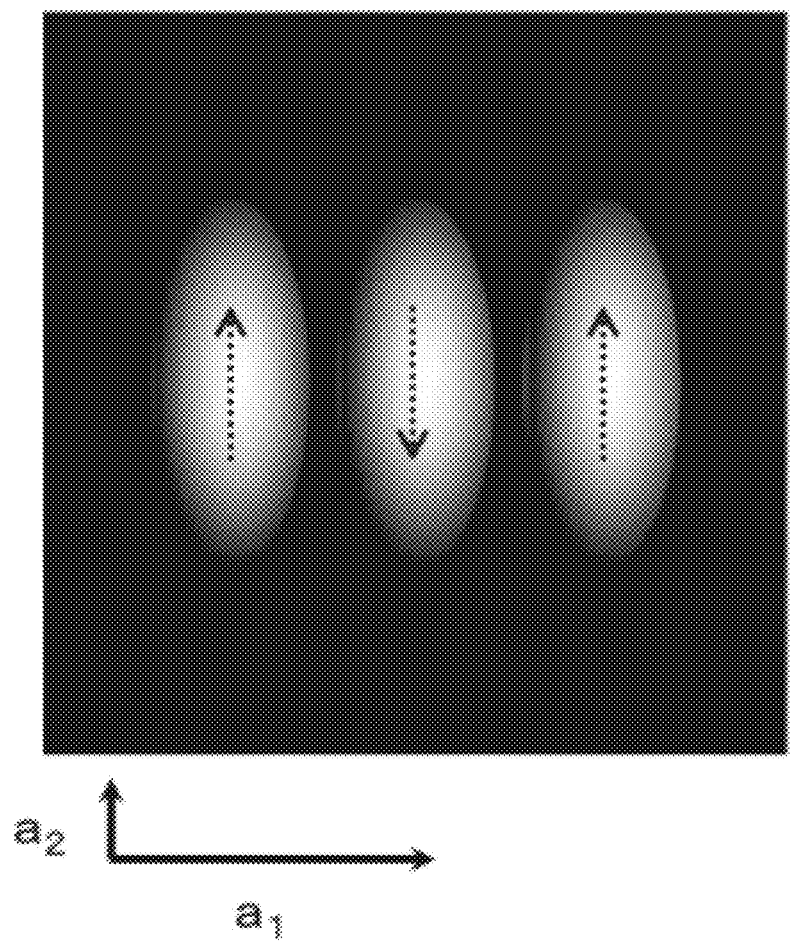
FIG. 7B is a view illustrating a far field pattern and a polarization direction of the surface emitting laser of the second embodiment.

FIG. 7B illustrates a schematic view of a far field pattern of the beam that is perpendicularly emitted from the surface emitting laser 100 of the second embodiment. The far field of FIG. 7B has the beam profile including three peaks. The one-dimensional polarization in which the polarization direction includes only the component in the $a_2$ direction is obtained. The polarization phase at the central peak rotates by 180 degrees with respect to the polarization phases at both end peaks. The dotted line of FIG. 7B expresses the polarization direction and the phase.

(Third Embodiment)

A third embodiment will be described.

Figure 8A:
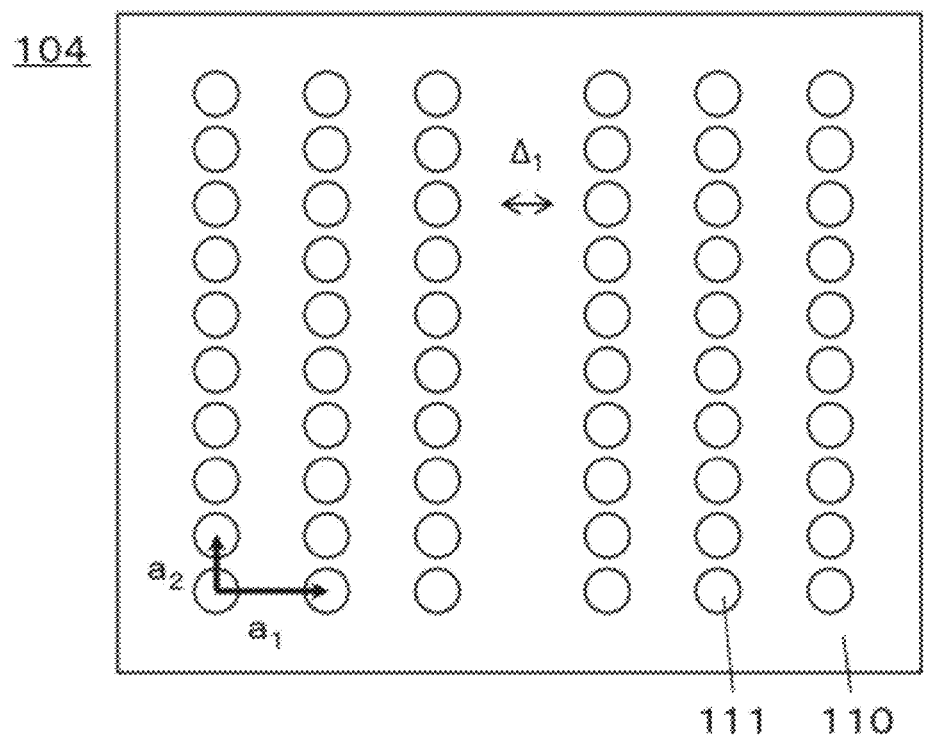
FIG. 8A is a plan view of a two-dimensional photonic crystal layer according to a third embodiment.
Figure 8B:
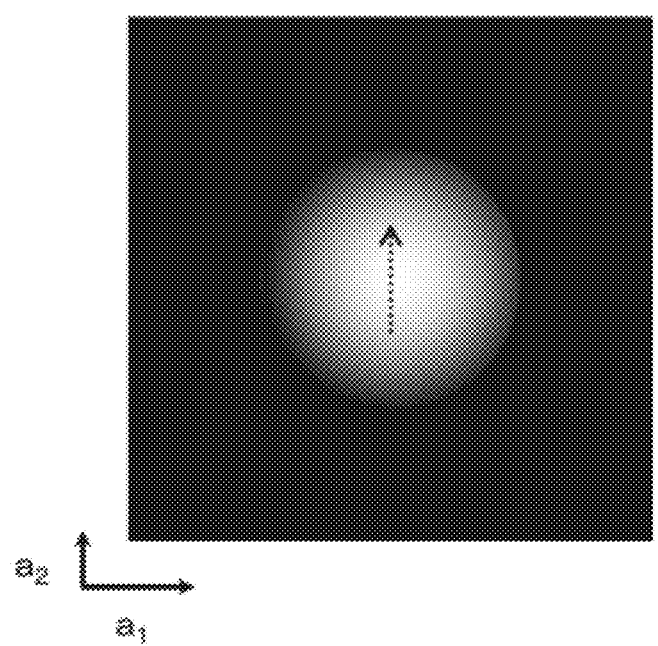
FIG. 8B is a view illustrating a far field pattern and a polarization direction of the surface emitting laser of the third embodiment.
Figure 9A:
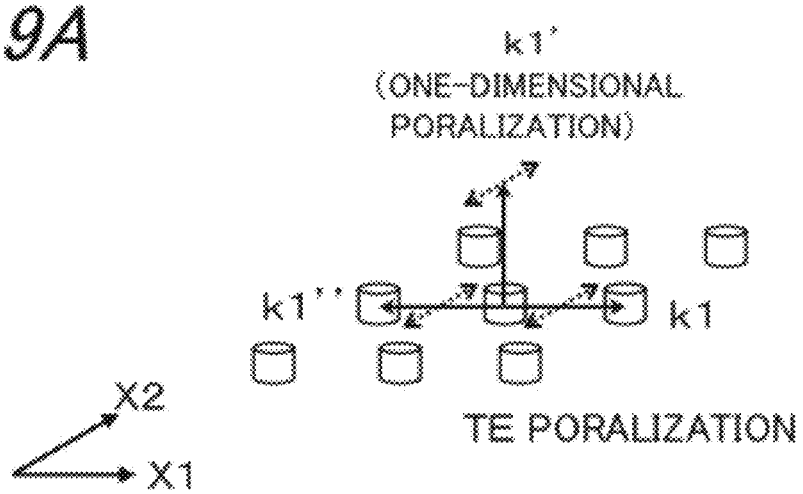
FIGS. 9A, 9B, and 9C are three-dimensional schematic views of a reciprocal lattice space expressing a diffraction phenomenon of the related art.
Figure 9B:
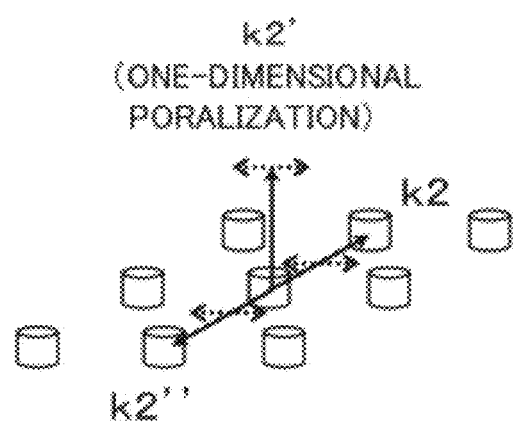
Figure 9C:
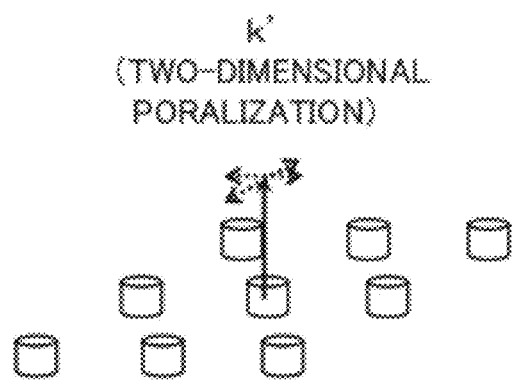

FIG. 8A is a plan view illustrating a two-dimensional photonic crystal layer 104 of the third embodiment, and the two-dimensional photonic crystal layer 104 includes a phase shift structure having a width of $\Delta_1 = \lambda_1 \times 2n_{eff1}$ in the direction of the primitive translation vector $a_1$. The phase of the resonance mode in the $a_1$ direction rotates by 180 degrees at the phase shift structure, and therefore the profile of the perpendicular output beam becomes a single peak. FIG. 8B illustrates a schematic view of a far field and the polarization direction of the surface emitting laser 100 of the third embodiment.

In the third embodiment, the phase shift has the width of $\Delta_1 = \lambda_1 \times 2n_{\mathit{eff}1}$. The same effect is obtained when the relational expression $\Delta_1 = s \times (\lambda_1 \times 2n_{\mathit{eff}1})$ described by an odd number s more than 0 is satisfied. In the third embodiment, although the two-dimensional photonic crystal layer includes one phase shift structure by way of example, alternatively, the two-dimensional photonic crystal layer may include at least two phase shift structures.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-249158, filed Nov. 5, 2010, which is hereby incorporated by reference herein in its entirety.

What is claimed is:

1. A surface emitting laser comprising a two-dimensional photonic crystal that includes a resonance mode in an in-plane direction,
    wherein the two-dimensional photonic crystal includes two primitive translation vectors of a primitive translation vector $a_1$ and a primitive translation vector $a_2$, which extend in different directions,
    the resonance mode includes at least a resonance mode resonating in a direction in which the primitive translation vector $a_1$ extends and a resonance mode resonating in a direction in which the primitive translation vector $a_2$ extends,
    the primitive translation vector $a_1$ has a length $|a_1|$, the primitive translation vector $a_2$ has a length $|a_2|$,
    the length $|a_1|$ satisfies a relational expression $|a_1| = p \times (\lambda_1/2n_{\mathit{eff}1})$ that is described by a resonance wavelength $\lambda_1$ in the resonance mode in the $a_1$ direction, an effective refractive index $n_{\mathit{eff}1}$ determined by the resonance mode in the $a_1$ direction, and an integer p of 2 or more,
    the length $|a_2|$ satisfies a relational expression $|a_2| = \lambda_2/2n_{\mathit{eff}2}$ that is described by a resonance wavelength $\lambda_2$ in the resonance mode in the $a_2$ direction and an effective refractive index $n_{\mathit{eff}2}$ determined by the resonance mode in the $a_2$ direction, and
    the resonance wavelength $\lambda_1$ and the resonance wavelength $\lambda_2$ satisfy a relational expression $\lambda_2 \leq 2 \times (n_{\mathit{eff}2}/(n_{out} + n_{\mathit{eff}2})) \times \lambda_1$ that is described by the effective refractive index $n_{\mathit{eff}2}$ and a refractive index $n_{out}$ of an external medium located out of the surface emitting laser.

2. The surface emitting laser according to claim 1, wherein the resonance wavelength $\lambda_2$ in the resonance mode in the $a_2$ direction satisfies a relational expression $\lambda_S \leq \lambda_2 \leq \lambda_1$ that is described by a shortest wavelength $\lambda_S$ in a emission wavelength region of an active layer and the resonance wavelength $\lambda_1$.

3. The surface emitting laser according to claim 2, wherein a gain of the active layer at the resonance wavelength $\lambda_1$ is larger than a gain of the active layer at the resonance wavelength $\lambda_2$.

4. The surface emitting laser according to claim 2, further comprising a mirror, which reflects light having the wavelengths of $\lambda_S$ to $\lambda_1$ to a gain region, on an outside of the two-dimensional photonic crystal.

5. The surface emitting laser according to claim 1, wherein the two-dimensional photonic crystal includes at least one phase shift structure, having a width $\Delta_1$, in the direction of the primitive translation vector $a_1$, and the width $\Delta_1$ satisfies a relational expression $\Delta_1 = s \times (\lambda_1 \times 2n_{\mathit{eff}1})$ that is described by an odd number s larger than 0.

* * * * *